US012750047B2

(12) United States Patent
Venigalla et al.

(10) Patent No.: US 12,750,047 B2
(45) Date of Patent: Sep. 29, 2026

(54) CURRENT SENSING IMPLEMENTATION FOR COMMON-DRAIN, BACK-TO-BACK POWER SWITCHES IN VERTICAL FET TECHNOLOGY

(71) Applicant: Cypress Semiconductor Corporation, San Jose, CA (US)

(72) Inventors: Ramakrishna Venigalla, Bengaluru (IN); Partha Mondal, Paschim Medinipur (IN); Rajesh Karri, Visakhapatnam (IN); Yogendra Pratap Singh, Moradabad (IN); Rushika Banam Balia Tudu, Bangalore (IN); Gerhard Thomas Nöbauer, Villach (AT); Arun Khamesra, Bangalore (IN); Ankur Anchlia, Indore (IN); Pulkit Shah, Bengaluru (IN)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 18/895,260

(22) Filed: Sep. 24, 2024

(65) Prior Publication Data

US 2025/0337404 A1 Oct. 30, 2025

(30) Foreign Application Priority Data

Apr. 30, 2024 (IN) ............................ 202411034337

(51) Int. Cl.
*H03K 17/00* (2006.01)
*H03K 17/0812* (2006.01)

(52) U.S. Cl.
CPC .................. *H03K 17/08122* (2013.01); *H03K 2217/0027* (2013.01)

(58) Field of Classification Search
CPC ........... H03K 17/08122; H03K 17/687; H03K 17/6871; H03K 2217/0027; H02H 9/046
See application file for complete search history.

(56) References Cited

U.S. PATENT DOCUMENTS

| | | | | |
|---|---|---|---|---|
| 9,337,823 | B2 * | 5/2016 | Li | H03K 17/161 |
| 2007/0127182 | A1 * | 6/2007 | Chang | H03K 17/0822 361/100 |
| 2016/0315494 | A1 * | 10/2016 | Maetani | H02J 7/007 |
| 2021/0210954 | A1 * | 7/2021 | Mallikarjunaswamy | H10D 62/184 |
| 2024/0230761 | A1 * | 7/2024 | Tzivanopoulos | H03K 17/687 |
| 2024/0322681 | A1 * | 9/2024 | Watanabe | H02M 3/158 |
| 2025/0158428 | A1 * | 5/2025 | Angkititrakul | H02J 7/00302 |
| 2025/0336749 | A1 * | 10/2025 | Venigalla | G01K 7/01 |

* cited by examiner

*Primary Examiner* — Tuan T Lam

(57) ABSTRACT

Techniques for load current sensing in common-drain power FET switches are described. In an example embodiment, a power field effect transistor (FET) device includes back-to-back power FETs connected to a common drain node. The power FET device also includes a first replica FET coupled to the common drain node and configured to provide a sense current representative of a load current flowing through the power FET device. The power FET device also includes a second replica FET coupled to the common drain node and configured to provide a sense voltage representative of a voltage of the common drain node. A current sense circuit coupled to the first replica FET and the second replica FET may be configured to use the sense voltage from the second replica FET to draw the sense current through the first replica FET.

18 Claims, 6 Drawing Sheets

CURRENT SENSING IMPLEMENTATION FOR COMMON-DRAIN, BACK-TO-BACK POWER SWITCHES IN VERTICAL FET TECHNOLOGY

PRIORITY; RELATED APPLICATIONS

This application claims the benefit of Indian Provisional Application No. 202411034337 filed on Apr. 30, 2024. The entire contents of the above-referenced application are hereby incorporated by reference in their entirety.

TECHNICAL FIELD

The present disclosure relates generally to the field of power delivery devices and systems and methods for controlling power delivery devices.

BACKGROUND

Various electronic devices (e.g., such as smartphones, tablets, notebook computers, laptop computers, hubs, chargers, adapters, etc.) may be configured according to Universal Serial Bus (USB) power delivery protocols defined in various revisions of the USB Power Delivery (USB-PD) specification for wired charging through USB Type-C (USB-C) connectors. For example, in some applications an electronic device may be configured as a power consumer to receive power through a USB-C connector (e.g., a laptop for charging its own battery), while in other applications an electronic device may be configured as a power provider (e.g., a laptop) to provide power to another device (e.g., a smartphone) that is connected thereto through a USB-C connector. The USB-PD specification allows power providers and power consumers to dynamically negotiate various power levels, e.g., such as 5V (Volts) at 3 A (Amps), 15V at 3 A, 20V at 3 A, 12V at 5 A, 20V at 5 A, 48V at 5 A, etc.

However, power delivery and control thereof is challenging in USB and other technologies that demand accurate power levels (e.g., voltage and/or current) and strict overvoltage and/or overcurrent protections.

BRIEF DESCRIPTION OF THE DRAWINGS

The disclosure is illustrated by way of example, and not of limitation, in the figures of the accompanying drawings.

DETAILED DESCRIPTION

Figure 1:
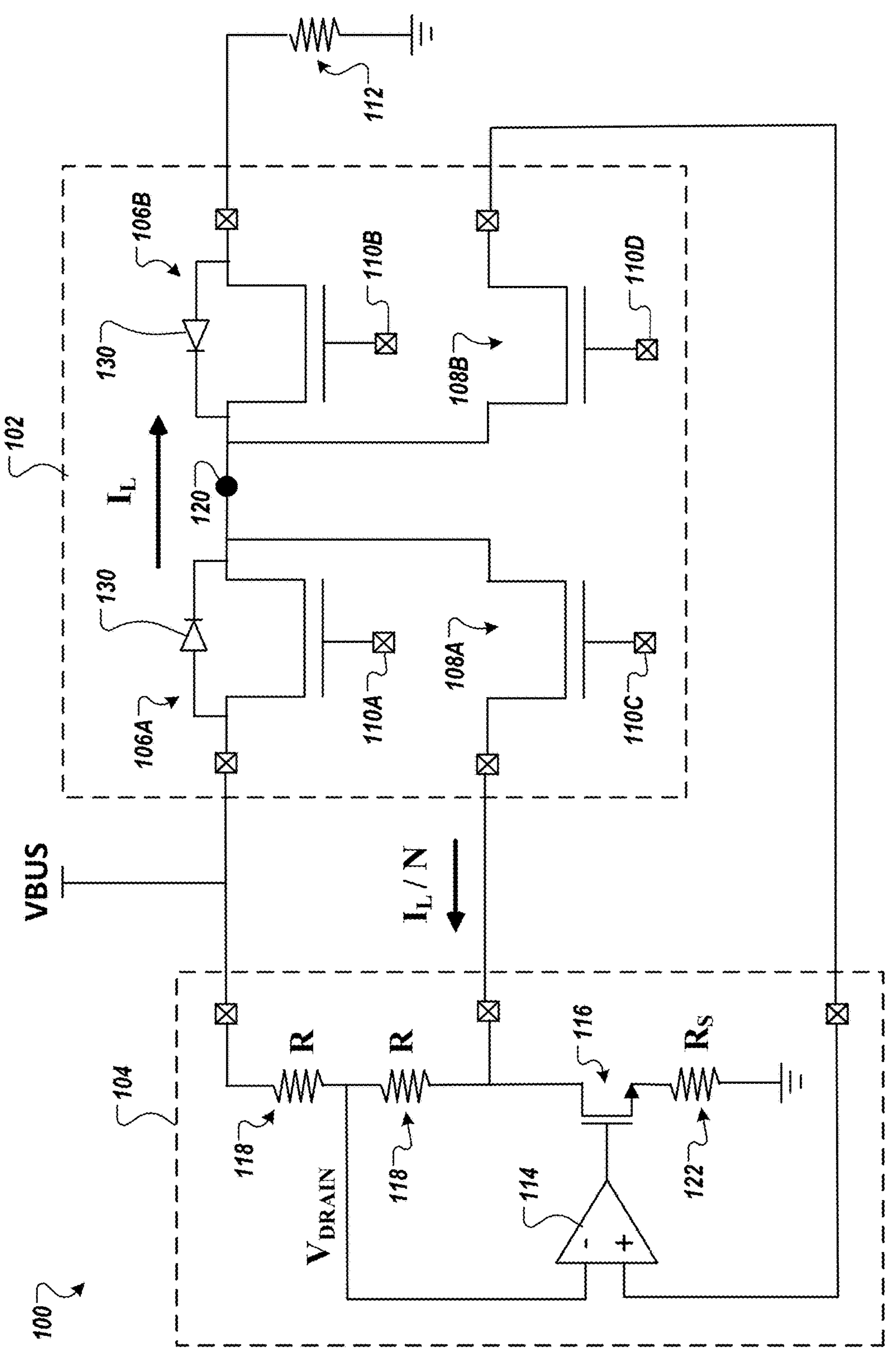
FIG. 1 illustrates a circuit block diagram of a device for load current sensing in common-drain power field effect transistor (FET) devices, according to some embodiments of the present disclosure.

The following description sets forth numerous specific details such as examples of specific systems, components, methods, and so forth, in order to provide a good understanding of various embodiments of the techniques described herein for load current sensing and current limiting in common-drain power FET switches implemented in vertical FET technology. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present disclosure.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the invention. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for current sensing and current limiting in power FET devices for various USB-enabled electronic devices. Examples of such USB-enabled electronic devices include, without limitation, personal computers (e.g., laptop computers, notebook computers, etc.), mobile computing devices (e.g., tablets, tablet computers, etc.), mobile communication devices (e.g., smartphones, cell phones, personal digital assistants, messaging devices, pocket PCs, etc.), audio/video/data recording and/or playback devices (e.g., cameras, voice recorders, hand-held scanners, etc.), and other similar electronic devices that can use USB-C connectors for battery charging and/or power delivery.

Some USB-enabled electronic devices may be compliant with a specific revision and/or version of the USB-PD specification. The USB-PD specification defines a standard protocol designed to enable the maximum functionality of USB-enabled devices by providing more flexible power delivery along with data communications over a single USB-C cable through USB-C ports. The USB-PD specification also describes the architecture, protocols, power supply behavior, parameters, and cabling necessary for managing power delivery over USB-C cables at up to 100 W of power (or higher, up to 240 W, in case of Extended Power Range, or EPR). According to the USB-PD specification, devices with USB-C ports (e.g., such as USB-enabled devices) may negotiate for more current and/or higher or lower voltages over a USB-C cable than are allowed in older USB specifications (e.g., such as the USB 2.0 Specification, the USB Battery Charging Specification Rev. 1.1/1.2, etc.). For example, the USB-PD specification defines the protocol for negotiating a power delivery contract (PD contract) between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, etc. According to the USB-PD specification, an electronic device is typically configured to deliver power to another device through a power path configured on a USB VBUS line. The device that provides power is typically referred to as (or includes) a "provider" (or a power source), and the device that consumes power is typically referred to as (or includes) a "consumer" (or a power sink). In some embodiments, a USB-PD power source can be configured to draw power from a direct current (DC) power source and can include a direct current-to-direct current (DC-DC) converter. In other embodiments, a USB-PD power source may be configured to draw power from an alternating current (AC) power adapter or from another AC source.

Power delivery and control thereof is typically challenging in USB-enabled and other technologies that demand accurate power levels (e.g., voltage and/or current) and strict overvoltage and/or overcurrent protections. Electronic devices are typically configured to transfer power through Field Effect Transistors (FETs), or other similar switching devices. In some instances, the FETs may become susceptible to electrical damage (e.g., overcurrent damage, overvoltage damage, overheating damage, reverse current damage, and so forth) due to, for example, one or more electrical faults possibly occurring on the USB-C connector system. Power delivery IC controllers in such technologies typically struggle to meet the conflicting demands of accurate power levels, protection, and efficiency in high-current (e.g., 3 A, or above) implementations and applications.

An electronic device typically uses a power-transfer circuit (power path) to transfer power to/from the device. Among other electronic components, a power path may include one or more power FETs that are coupled in-line on the circuit path to operate as switches (e.g., as "ON"/"OFF" switches). Power FETs differ in some important characteristics from FETs and other types of transistor switch devices that are used for other, non-power-transfer applications. As a discrete semiconductor switching device, a power FET may carry a large amount of current between its source and its drain while it is "ON", may have low resistance from its source to its drain while it is "ON", and may withstand high voltages from its source to its drain while it is "OFF". For example, a power FET may be characterized as being able to carry currents in the range of several hundred milliamps (e.g., 500-900 mA) to several amps (e.g., 3-5 A, or higher), and to withstand voltages in the range of 12V to 40V (or higher) across its source to its drain. For example, the resistance between the source and the drain of a power FET device may be very small in order to prevent, for example, the power loss across the device. The examples, implementations, and embodiments disclosed herein may use different types of FETs such as metal-oxide FETs (MOSFETs), nFETs (e.g., N-type MOSFETs), pFETS (e.g., P-type MOSFETS), etc.

Vertical FETs are a relatively new advancement in FET design. Vertical FETs offer several advantages over traditional lateral FET designs such as higher current density, improved thermal performance, smaller device scale, and higher die-area efficiency, among others. Due to these advantages, vertical FETs are advantageous for high-density integrated circuits. However, vertical FETs present additional challenges with regard to current sensing.

In some conventional implementations, load current is sensed through a sense resistor implemented in series with the power FETs. However, due to the presence of a sense resistor in the load path, this technique typically results in high power losses that are undesirable for applications such as USB Type-c power delivery chips.

Another approach for sensing current in dual power FET devices involves the use of a replica FET, which is fabricated in the same integrated circuit die. The power FET device is configured so that the current through the replica FET mirrors the current through the power FETs at a known ratio determined by the size ratio between power FET and the smaller replica FET. This ratio may be referred to as $k_{ILIS}$, meaning that the load current $I_L$ is $k_{ILIS}$ times higher than sense current $I_S$, $I_L=k_{ILIS}\times I_S$. In some embodiments, the typical $k_{ILIS}$ ratio may be approximately 3000. In this way, the much smaller sense current through the replica FET can be measured and processed to provide the load current through the power FETs. However, the conventional circuitry used to implement this current sensing approach requires the drain nodes of the main power FET and its replica to be separate. Separating the drain nodes of the power FET and the replica FET is relatively simple to achieve with lateral FETs, but is difficult to accomplish with vertical FETs. If dual power FETs are implemented in vertical FET technology, the conventional current sensing approach would require various process technology changes. For example, process technology changes would be needed to separate the drain terminals of main power FETs from the drain terminals of the replica FETs and/or to enable access the common drain terminal of vertical power FETs (e.g., back-side metallization per die, etc.). However, the costs associated with such technology changes may be prohibitive.

To address these and other deficiencies of conventional current sensing in power FET devices, the techniques described herein provide a current sensing technique for a common-drain dual power FET device with vertical FETs. A power FET device in accordance with embodiments includes dual power FETs arranged in series and sharing a common drain node (i.e., back-to-back). The power FET device also includes at least two replica FETs fabricated within the same die, wherein a drain of each replica FET is coupled to the common drain node of the two power FETs. One of the replica FETs (referred to herein as the current sense FET) is to provide a sense current representative of the load current flowing through the power FET device, while another one of the replica FETs (referred to herein as the voltage sense FET) is to provide a sense voltage representative of the voltage of the common drain node. The current sense FET and the voltage sense FET are coupled to a current sense circuit configured to measure a sense current that is proportional to the load current through the power FETs. The current sense circuit uses the sense voltage from the voltage sense FET (i.e., the voltage of the common drain node) to draw the sense current through the current sense FET. More specifically, the sensed voltage of the common drain node is used to generate a voltage across the current sense FET that matches the source-to-drain voltage drop across the corresponding power FET. In this way, a current is generated through the current sense FET that is in the proper $K_{ILIS}$ ratio relative to the corresponding power FET.

The sensed current can then be used in a variety of ways, such as to protect against over current faults and other applications. For example, the sensed current can be digitized and processed (e.g., by an IC controller) and used to by firmware to manage or discontinue the load current. In some embodiments, the sensed current can be received by a current limit circuit, which uses the sensed current to limit the load current at or below a maximum current level.

In some embodiments, the techniques described herein provide for implementing such power FET devices in vertical FET technology, thereby improving power efficiency while allowing for delivery and control of higher currents than lateral FETs. However, it will be appreciated that although the disclosed techniques may be particularly well suited for power FET devices that include back-to-back vertical FETs with a common drain, the disclosed techniques are not limited to such embodiments. For example, the disclosed techniques can also be used with lateral FETs and FET devices that use a single power FET rather than dual power FETs.

In some embodiments, the techniques described herein also allow for implementing such a power FET device along with an IC controller die in a SiP package or dual-chip module. In some USB-enabled embodiments, the techniques described herein are compliant with common footprint definitions, making such embodiments readily available for design-in by vendors into various electronic devices such as laptops and notebooks.

FIG. 1 illustrates a circuit block diagram of a device 100 for load current sensing in a common-drain power FET device 102, according to some example embodiments of the present disclosure. The device 100 may include a power FET device 102 and a current sense circuit 104. In some embodiments, the power FET device 102 and a current sense circuit 104 may be instantiated on separate dies and enclosed in a single chip carrier package as a system in package (SiP) device.

The power FET device 102 is a power switch, instantiated on a single die, that includes two power FETs 106A and 106B and respective replica FETs 108A and 108B. The gates of the power FETS 106 and the replica FETs 108 may have separate gate terminals. However, in some embodiments, the gate of power FET 106A is connected internally to the gate of replica FET 108A such that both FETs are controlled by one common signal applied to a first common gate terminal. Similarly, the gate of power FET 106B may be connected internally to the gate of replica FET 108B such that both FETs are controlled by one common signal applied to a second common gate terminal.

According to the techniques described herein, the power FETs 106 are disposed back-to-back within power FET device 102, so in operation a load current, $I_L$, flows from the bus voltage, VBUS, to the load 112 as depicted. In addition, power FETs 106 are drain-connected to share a common drain node 120. The diodes 130 represent bulk diodes (also referred to as body diodes) which may be incorporated within the structure of the respective FETs. The power FET device 102 is depicted as operating in a power delivery mode. However, power FET device 102 can also be configured to operate in a power receiving mode, in which case the current through the power FETs 106A and 106B will be in the opposite direction relative to what is shown in FIG. 1.

The replica FETs 108 are area-scaled versions of power FETs 106, respectively. Although not shown, the replica FETs may also include respective bulk diodes. The drains of both replica FETs 108 are also coupled to the same common drain node 120 as the two power FETs 106. Thus, all four FETs in the power FET device 102 share a common drain. The common drain node 120 can be accessed by fabricating the replica FETs in linear mode or using simple contact masks. The voltage at the common drain 120 may be referred to herein as VDRAIN.

During operation, the gates 110A and 110B of the power FETs 106 are controlled by a gate driver (not shown) to turn on the power FETs 106 and thereby connect the bus voltage, VBUS, to the load 112 to provide current to the load 112. In some embodiments, the magnitude of the bus voltage may be determined in accordance with a power delivery contract as described above. Additionally, the corresponding gates 110C and 110D of the replica FETs 108 are activated by the gate driver to enable current sensing. In the example embodiment shown in FIG. 1, the connections between the current sense circuit 104 and the two replica FETs 108 cause the replica FET 108A to be configured as a current sense FET and the replica FET 108B to be configured as a voltage sense FET.

As shown in FIG. 1, the source terminal of the replica FET 108B (the voltage sense FET) is coupled to the non-inverting input of an operational amplifier (op amp) 114. The op amp 114 is configured as a closed-loop amplifier, which includes the op amp 114, a transistor 116 (e.g., FET), and a voltage divider made up of two resistors 118 of equal resistance, R. The resistance, R, of resistors 118 may be several times greater than the resistance of the power FETs 106 (e.g., 500 Ohms or more). The inverting input of the op amp 114 is coupled to the first replica FET 108A (the current sense FET) through the voltage divider, i.e., between resistors 118.

The sense voltage received at the non-inverting input of the op amp 114 is equal (or nearly equal) to the voltage level, VDRAIN, of the common drain node 120 between the power FETs 106. To achieve equilibrium, the inverting input of the op amp 114 becomes equal to non-inverting input. Thus, the sense voltage, VDRAIN, is transferred to the node between the resistors 118 of the voltage divider. As a result, the source-to-drain voltage drop across the replica FET 108A will be equal (or nearly equal) in magnitude to the source-to-drain voltage drop across the power FET 106A, but with opposite polarity. Thus, the current, $I_L/N$, through the replica FET 108A will be in the proper $K_{ILIS}$ ratio relative to the load current, $I_L$, through the power FET 106A. Furthermore, since the resistance, R, provided by resistors 118 is several times greater than the source-to-drain resistance of the power FET 106A, the source-to-drain current through the transistor 116 will be approximately equal to the sense current, $I_L/N$.

In some embodiments, a sense resistor 122 (Rs) may be coupled between the output of the transistor 116 and ground to convert the sense current, $I_L/N$, to a voltage. The voltage across the sense resistor 122 (Rs) may be digitized using an analog-to-digital converter (not shown) and processed to obtain a numerical value for the detected load current, $I_L$. This value for the detected load current may be used, for example, in a feedback loop that controls the bus voltage (VBUS) and/or gate driver (not shown) to change or limit the load current or maintain the load current at a specified level.

It will be appreciated that the circuit depicted in FIG. 1 is one example of a current sensing technique in accordance with embodiments, and that various modifications may be made without departing from the scope of the claims. Additional embodiments of the present techniques are described further in relation to FIGS. 2 and 3.

Figure 2:
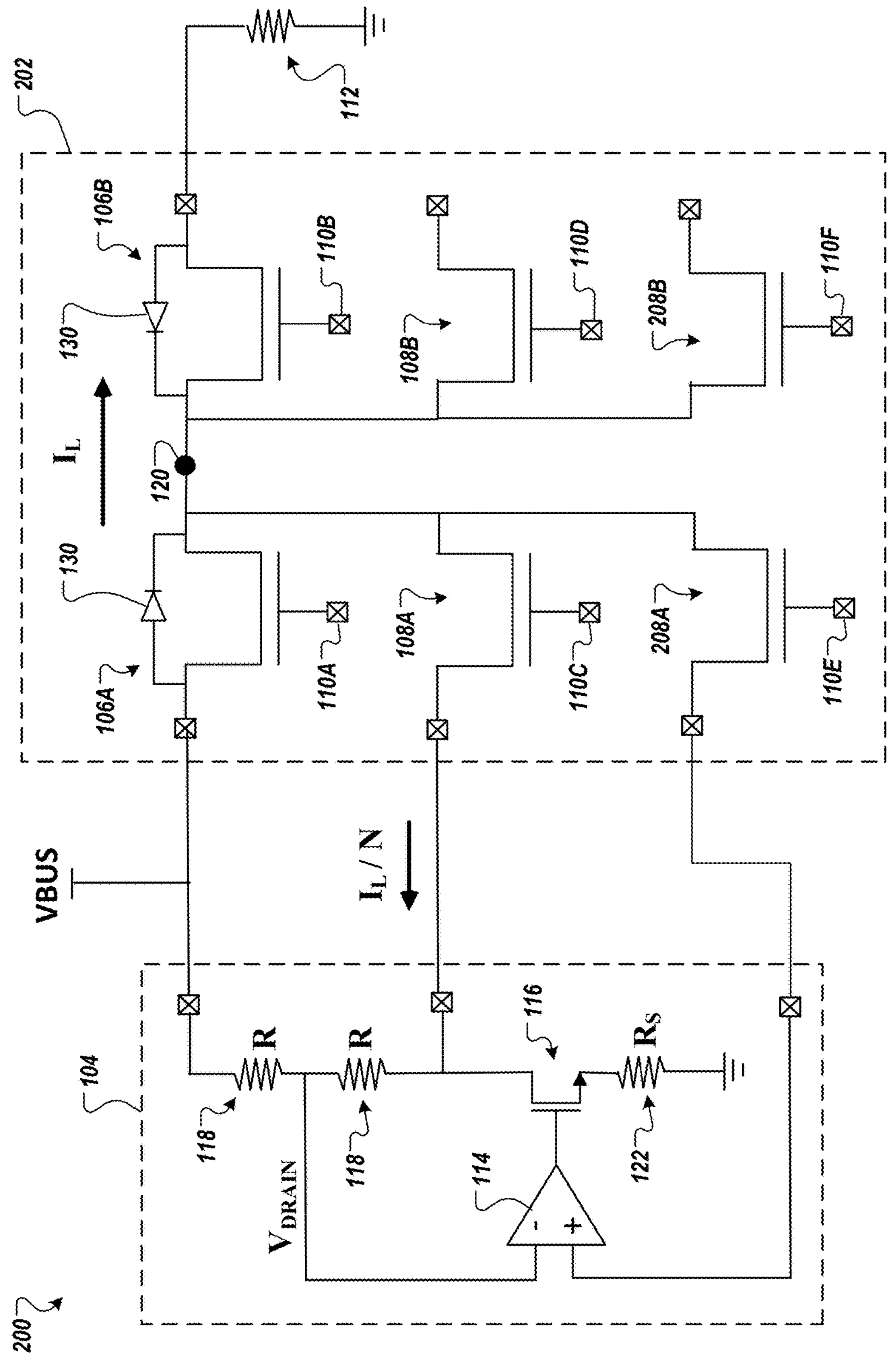
FIG. 2 illustrates a circuit block diagram of another device for load current sensing in a common-drain power FET device, according to some embodiments of the present disclosure.

FIG. 2 illustrates a circuit block diagram of a device 200 for load current sensing in a common-drain power FET device 202, according to some example embodiments of the present disclosure. The circuit illustrated in FIG. 2 is similar to the circuit of FIG. 1, except that the power FET device 202 includes an additional pair of replica FETs 208A and 208B. As in FIG. 1, the replica FETs 108A, 108B, 208A, and 208B are area-scaled versions of power FETs 106A and 106B, respectively, and the drains of all four replica FETs 108A, 108B, 208A, and 208B are coupled to the same common drain node 120 as the two power FETs 106A and 106B.

In the example shown in FIG. 2, the gates of the replica FETs 208A and 208B may have separate gate terminals 110E and 110F, respectively. However, in some embodiments, the gate of power FET 106A is connected internally to the gate of replica FET 108A and replica FET 208A so that they share a common gate terminal. Similarly, the gate of power FET 106B may be connected internally to the gate of replica FET 108B and replica FET 208B so that they share a common gate terminal.

The current sensing operates according to the same principle described above in relation to FIG. 1, except that the sense voltage is provided by the replica FET 208A rather than the replica FET 108B. Replica FETs 108B and 208B may not be necessary for sensing the load current, $I_L$, but may be used for other purposes such as current mirroring applications. During operation, the replica FETs 108B and 208B may be coupled to other circuitry (not shown) such as an additional current sense circuit or may be coupled to ground through respective resistors.

The power FET device 202 can also be configured to operate in a power receiving mode, in which case the current through the power FETs 106A and 106B will be in the opposite direction relative to what is shown in FIG. 2. If the power FET device 202 is operating in the power receiving mode, the current sensing may be implemented on the opposite side of the power FET device 202 using the replica FETs 108B and 208B. Accordingly, an additional current sensing circuit 104 may be coupled to the replica FETs 108B and 208B to be used when operating in the power receiving mode.

Figure 3:
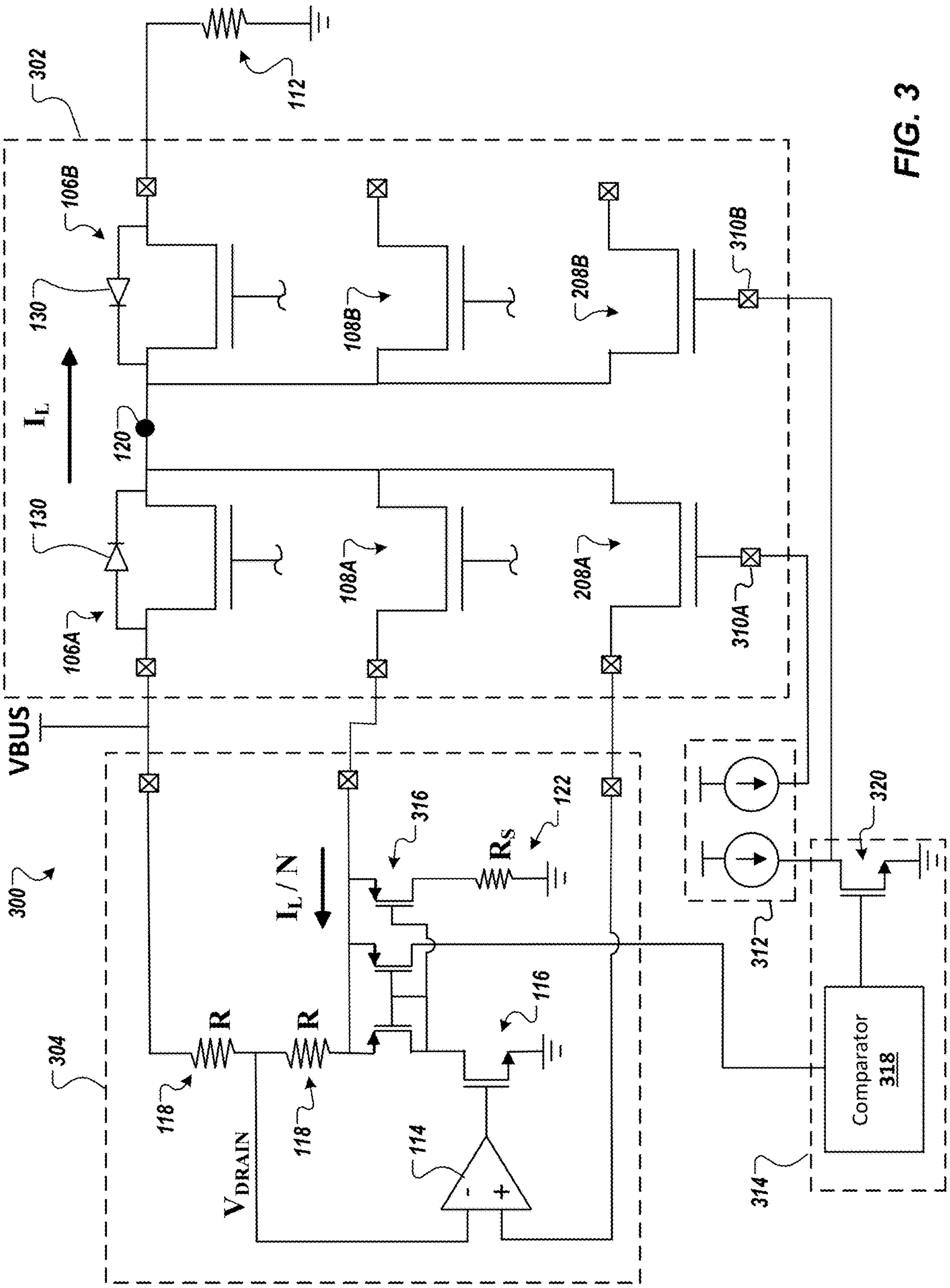
FIG. 3 illustrates a circuit block diagram of another device for load current sensing in a common-drain power FET device, according to some embodiments of the present disclosure.

FIG. 3 illustrates a circuit block diagram of a device 300 for load current sensing in a common-drain power FET device 302, according to some example embodiments of the present disclosure. The circuit illustrated in FIG. 3 is similar to the circuit of FIG. 2 and includes the additional replica FETs 208A and 208B. Additionally, in the example shown in FIG. 3, the gate of power FET 106A is connected internally to the gate of replica FET 108A and replica FET 208A so that they share a common gate terminal 310A. Similarly, the gate of power FET 106B is connected internally to the gate of replica FET 108B and replica FET 208B so that they share a common gate terminal 310B. For the sake of simplifying the illustration, the conductive connections between the respective gates are not shown. For purposes of the present description, the power FET 106A may be referred to as the input power FET 106A and the power FET 106B may be referred to as the output power FET 106B.

Also shown in FIG. 3 is a gate driver 312, which includes two current sources. One current source is coupled to the gate terminal 310A to provide a gate signal to the input power FET 106A and its respective replica FETS 108A and 208A. The other current source is coupled to the gate terminal 310B to provide a gate signal to the output power FET 106B and its respective replica FETS 108B and 208B.

The current sensing operates according to the same principle described above in relation to FIGS. 1 and 2, except that current sense circuit 304 includes a current mirror circuit 316, which causes the source-to-drain current through the transistor 116 to be replicated to two or more outputs so that the sense current, $I_L/N$, can be used for multiple purposes. For example, one output of the current mirror circuit 316 may be coupled to the sense resistor 122 ($R_S$) used to convert the sense current, $I_L/N$, to a voltage as described above. In addition to the outputs shown in FIG. 3, the current mirror circuit 316 may also have any suitable number of additional outputs to provide the sense current to other components.

A different output of a current mirror circuit 316 provides the sense current, $I_L/N$, to the current limit circuit 314. The current limit circuit 314 limits the load current, $I_L$, through the power FETs 106A and 106B to a current limit that is specified for the particular application. For example, in a USB-enabled application, the current limit is dynamically determined by the PD contract established between the provider and the consumer. In such applications, the current limit may be determined using suitable firmware-controlled and/or programmable circuit (e.g., such as a circuit with controllable current source).

The current limit circuit 314 may be implemented using any suitable circuitry. In the example shown in FIG. 3, the current limit circuit 314 includes a comparator 318 and a current limiting transistor 320 (e.g., a FET), which is coupled to the gate terminal 310B of the output power FET 106B. The comparator 318 compares the received sense current, $I_L/N$, to a reference current that represents the specified current limit. When the comparator 318 detects that the current limit is exceeded, the comparator 318 applies a control signal to the gate of the current limiting transistor 320. The activation of the current limiting transistor 320 causes a portion of the current from the gate driver 312 to be shunted to ground, which reduces the magnitude of the current provided to the gate terminal 310B. This, in turn, increases the resistance of the output power FET 106B and limits the load current, $I_L$, to the specified maximum current level. In this way, the current limit circuit 314 can limit the current through the output power FET 106B, which effectively also limits the current through power FET device 102.

The current limiting configuration described above has a notable advantage, which is related to the electrical characteristics of most FETs. Specifically, when the gate signal applied to a FET is reduced enough to significantly increase the FET's resistance, the FET no longer operates in the linear region. As a result, the ratio of the current through the FET and any associated replica FET would change, meaning that the ratio of the load current and the sense current would deviate from the expected $K_{ILIS}$ ratio. Such deviations are difficult to characterize and compensate for. However, in the described embodiment, the load current is controlled by controlling the resistance of only the output power FET 106B. The resistance of the input power FET 106A is unaffected by the current limit circuit 314. Thus, the sense current through the replica FET 108A will be in the proper ratio compared to the current through the input power FET 106A regardless of the state of the current limit circuit 314.

In this manner, the techniques described herein use the sense accuracy and control that is inherent when performing the current sensing on the input power FET 106A using replica FETs 108A and 208A, which continue to operate in the linear region even when the load current is being limited by the current limit circuit 314. On the other hand, the techniques described herein also enable control of the load current through the power FET device 102 by controlling the resistance of the output power FET 106B without effecting the accuracy of the current sensing.

The power FET device 302 can also be configured to operate in a power receiving mode, in which case the current through the power FETs 106A and 106B will be in the opposite direction relative to what is shown in FIG. 3. If the power FET device 302 is operating in the power receiving mode, the current sensing and current limiting operations may swap positions on the power FET device 302. In other words, current sensing may be implemented using the replica FETs 108B and 208B and current limiting may be implemented using the power FET 106A. Accordingly, an additional current sensing circuit 304 may be coupled to the power FET 106B and the replica FETs 108B 208B and an additional current limit circuit 314 may be coupled to the gate drive of power FET 106A for operating in the power receiving mode.

Figure 4:
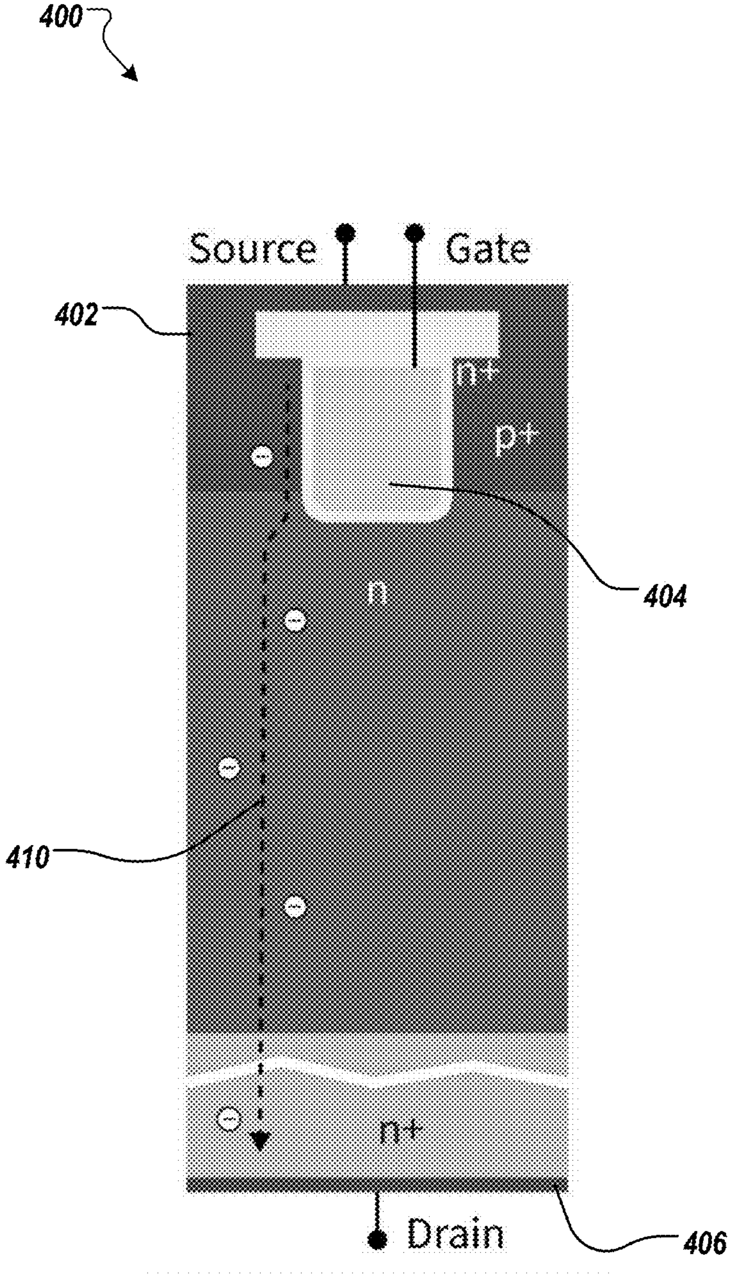
FIG. 4 illustrates an example structure of a vertical field effect transistor (FET) in accordance with some embodiments of the present disclosure.

FIG. 4 illustrates an example structure of a vertical FET 400 in accordance with some embodiments. The vertical FET 400 shown in FIG. 4 may be referred to as a trench MOSFET. However, the current techniques may be suitable for any type of vertical FET, including Vertical MOSFETs (VMOS), vertical diffused MOSFETs (VDMOS), and others. Furthermore, embodiments of the disclosed techniques are not limited to the specific arrangement shown on FIG. 4, which is provided merely to present one example of vertical FET technology that may benefit from the disclosed techniques.

As shown in FIG. 4, the source 402 and the gate 404 are disposed on the top surface of the vertical FET 400 and the drain 406 is disposed on the bottom surface of the vertical FET 400 on the opposite side of the bulk semiconductor substrate compared to the source 402 and the gate 404. The direction of current flow is in the vertical direction from the source 402 to the drain 406 as indicated by the arrow 419. Typically, any additional vertical FETs fabricated in the same die will be oriented in similar fashion with the drain 406 on the bottom surface. Since the drain 406 is on the same semiconductor layer as the drains of any adjacent vertical FETs, it is relatively simple and cost efficient to fabricate two or more vertical FETs that share a connected/common drain. Vertical FETs such as the one depicted in FIG. 4 use much less lateral area compared to lateral FETs. Thus, such vertical FETs may be well suited for integrated circuit applications that benefit from higher circuit density.

Figure 5:
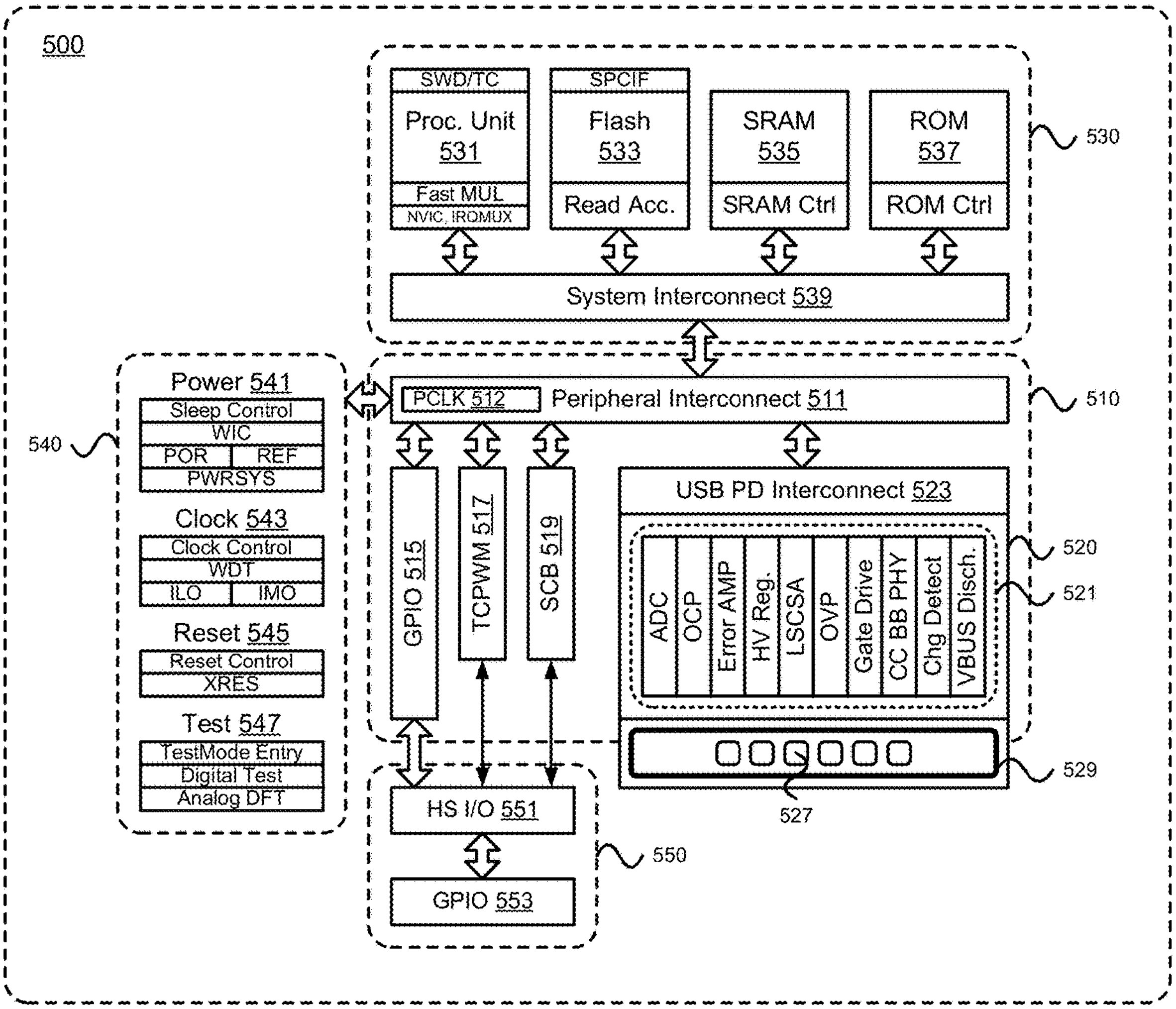
FIG. 5 is a block diagram illustrating an integrated circuit (IC) controller that can be configured together with a power FET semiconductor device on a provider and/or consumer power path, in accordance with some embodiments of the present disclosure.

FIG. 5 is a block diagram illustrating an IC controller 500 that can be configured as a USB-PD controller together with a power FET semiconductor device on a provider and/or a consumer power path, in accordance with some embodiments. IC controller 500 may include a peripheral subsystem 510 including components for use in USB-PD power delivery. Peripheral subsystem 510 may include a peripheral interconnect 511 including a clocking module, peripheral clock (PCLK) 512 for providing clock signals to the various components of peripheral subsystem 510. Peripheral interconnect 511 may be a peripheral bus, such as a single-level or multi-level advanced high-performance bus (AHB), and may provide a data and control interface between peripheral subsystem 510, CPU subsystem 530, and system resources 540. Peripheral interconnect 511 may include controller circuits, such as direct memory access (DMA) controllers, which may be programmed to transfer data between peripheral blocks without input by, control of, or burden on CPU subsystem 530.

The peripheral interconnect 511 may be used to couple components of peripheral subsystem 510 to other components of IC controller 500. Coupled to peripheral interconnect 511 may be a number of general purpose input/outputs (GPIOs) 515 for sending and receiving signals. GPIOs 515 may include circuits configured to implement various functions such as pull-up, pull-down, input threshold select, input and output buffer enabling/disable, single multiplexing, etc. Still other functions may be implemented by GPIOs 515. One or more timer/counter/pulse-width modulator (TCPWM) 517 may also be coupled to the peripheral interconnect and include circuitry for implementing timing circuits (timers), counters, pulse-width modulators (PWMs) decoders, and other digital functions that may operate on I/O signals and provide digital signals to system components of IC controller 500. Peripheral subsystem 510 may also include one or more serial communication blocks (SCBs) 519 for implementation of serial communication interfaces such as inter-integrated circuit (I2C), serial peripheral interface (SPI), universal asynchronous receiver/transmitter (UART), controller area network (CAN), clock extension peripheral interface (CXPI), etc.

Peripheral subsystem 510 may include a USB power delivery subsystem 520 coupled to the peripheral interconnect and comprising a set of USB-PD modules 521 for use in USB power delivery. USB-PD modules 521 may be coupled to the peripheral interconnect 511 through a USB-PD interconnect 523. USB-PD modules 521 may include an analog-to-digital conversion (ADC) module for converting various analog signals to digital signals; an error amplifier (AMP) regulating the output voltage on VBUS line per a PD contract; a high-voltage (HV) regulator for converting the power source voltage to a precise voltage (such as 3.5-5V) to power IC controller 500; a high-side or low-side current sense amplifier (LSCSA) for measuring load current accurately, an over voltage protection (OVP) module and an over-current protection (OCP) module for providing over-current and over-voltage protection on the VBUS line with configurable thresholds and response times; one or more gate drivers for external power field effect transistors (FETs) used in USB power delivery in provider and/or consumer configurations; and a communication channel PHY (CC BB PHY) module for supporting communications on a USB-C communication channel (CC) line. USB-PD modules 521 may also include a charger detection module for determining that a charging circuit is present and coupled to IC controller 500 and a VBUS discharge module for controlling discharge of voltage on VBUS. The discharge control module may be configured to couple to a power source node on the VBUS line or to an output (power sink) node on the VBUS line and to discharge the voltage on the VBUS line to the desired voltage level (i.e., the voltage level negotiated in the PD contract). USB power delivery subsystem 520 may also include pads 527 for external connections and electrostatic discharge (ESD) protection circuitry 529, which may be required on a Type-C port. USB-PD modules 521 may also include a bi-directional communication module for supporting bi-directional communications with another controller.

GPIO 515, TCPWM 517, and SCB 519 may be coupled to an input/output (I/O) subsystem 550, which may include a high-speed (HS) I/O matrix 551 coupled to a number of GPIOs 553. GPIOs 515, TCPWM 517, and SCB 519 may be coupled to GPIOs 553 through HS I/O matrix 551.

IC controller 500 may also include a central processing unit (CPU) subsystem 530 for processing commands, storing program information, and data. CPU subsystem 530 may include one or more processing units 531 for executing instructions and reading from and writing to memory locations from a number of memories. Processing unit 531 may be a processor suitable for operation in an integrated circuit (IC) or a system-on-chip (SOC) device. In some embodiments, processing unit 531 may be optimized for low-power operation with extensive clock gating. In this embodiment, various internal control circuits may be implemented for processing unit operation in various power states. For example, processing unit 531 may include a wake-up interrupt controller (WIC) configured to wake the processing unit up from a sleep state, allowing power to be switched off when the IC or SOC is in a sleep state. CPU subsystem 530 may include one or more memories, including a flash memory 533, and static random-access memory (SRAM) 535, and a read-only memory (ROM) 537. Flash memory 533 may be a non-volatile memory (NAND flash, NOR flash, etc.) configured for storing data, programs, and/or other firmware instructions. Flash memory 533 may include a read accelerator and may improve access times by integration within CPU subsystem 530. SRAM 535 may be a volatile memory configured for storing data and firmware instructions accessible by processing unit 531. ROM 537 may be configured to store boot-up routines, configuration parameters, and other firmware parameters and settings that do not change during operation of IC controller 500. SRAM 535 and ROM 537 may have associated control circuits. Processing unit 531 and the memories may be coupled to a system interconnect 539 to route signals to and from the various components of CPU subsystem 530 to other blocks or modules of IC controller 500. System interconnect 539 may be implemented as a system bus such as a single-level or multi-level AHB. System interconnect 539 may be configured as an interface to couple the various components of CPU subsystem 530 to each other. System interconnect 539 may be coupled to peripheral interconnect 511 to provide signal paths between the components of CPU subsystem 530 and peripheral subsystem 510.

IC controller 500 may also include a number of system resources 540, including a power module 541, a clock module 543, a reset module 545, and a test module 547. Power module 541 may include a sleep control module, a wake-up interrupt control (WIC) module, a power-on-reset (POR) module, a number of voltage references (REF), and a power system (PWRSYS) module. In some embodiments, power module 541 may include circuits that allow IC controller 500 to draw and/or provide power from/to external sources at different voltage and/or current levels and to support controller operation in different power states, such as active, low-power, or sleep. In various embodiments, more power states may be implemented as IC controller 500 throttles back operation to achieve a desired power consumption or output. Clock module 543 may include a clock control module, a watchdog timer (WDT), an internal low-speed oscillator (ILO), and an internal main oscillator (IMO). Reset module 545 may include a reset control module and an external reset (XRES) module. Test module 547 may include a module to control and enter a test mode as well as testing control modules for analog and digital functions (digital test and analog DFT).

In some embodiments, IC controller 500 may be implemented in a monolithic (e.g., single) semiconductor die. According to the techniques described herein, in some embodiments the IC controller 500 die is disposed along with a power FET semiconductor die in a single package as a SiP or a single multi-chip module. The power FET die includes two back-to-back power FETs with a connected/common drain, along with respective replica FETs for sensing the load current at the common drain, as described heretofore. In such embodiments, peripheral subsystem 510 of IC controller 500 includes one or more gate drivers (e.g., gate driver 312 of FIG. 3) that are coupled (through respective terminals) to the FETs of the power FET die to control the power FETs therein in provider or consumer configurations and to activate the replica FETs for current sensing and/or voltage sensing operations, in accordance with the techniques described herein. Additionally, the peripheral subsystem 510 of IC controller 500 may include the current limit circuit 314 of FIG. 3 and the any of the current sensing circuits 104 304 described in relation to FIGS. 1-3. For example, the gate drivers 312, current limit circuit 314, and current sensing circuits 104 304 may be components of the USB-PD modules 521.

Figure 6:
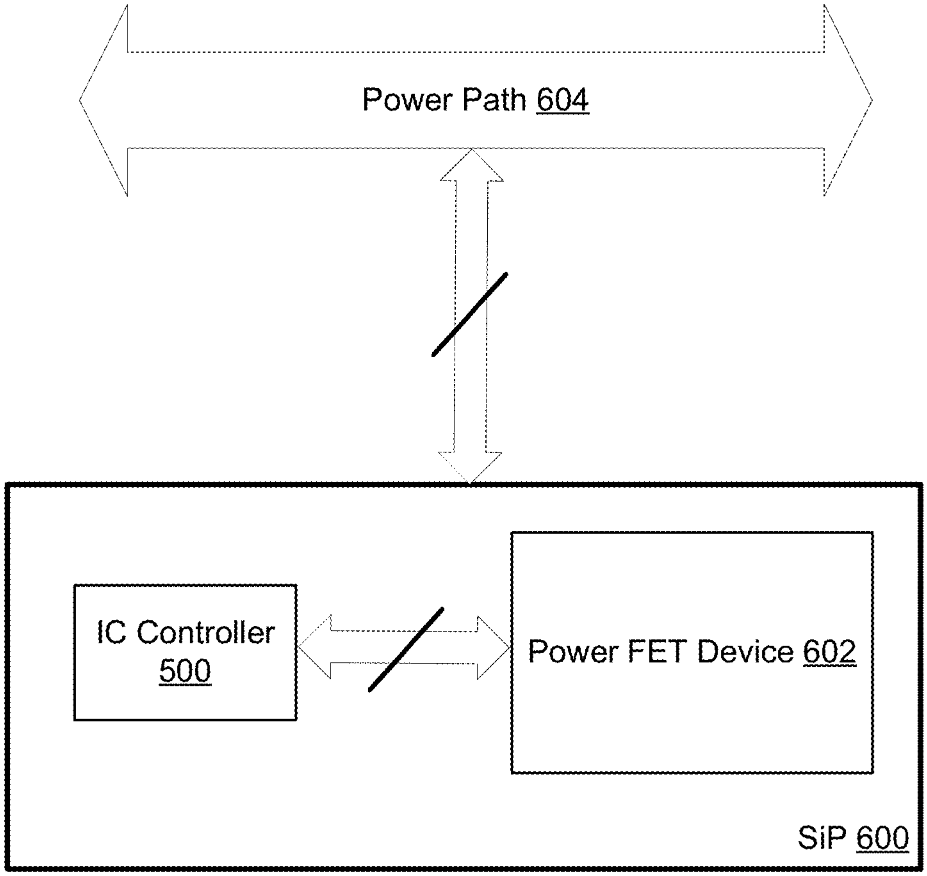
FIG. 6 is a block diagram illustrating a System-In-Package (SiP) including an IC controller and a power FET semiconductor device within a single package, in accordance with some embodiments of the present disclosure.

FIG. 6 is a block diagram illustrating a System-In-Package (SiP) 600 including an IC controller 500 and a power FET device 602 within a single package, in accordance with some embodiments. The power FET device 602 may be any one of the power FET devices 102, 202, and 302 described above in relations to FIGS. 1-3. Within SiP 600, various terminals of IC controller 500 are coupled over multiple metal lines (or bus) to the terminals of power FET device 602, in accordance with the techniques described herein. As illustrated, multiple pins of SiP 600 can be coupled to other components of a power path 604. In various implementations, power path 604 can be a provider power path (e.g., to provide power to a consumer) or a consumer power path (e.g., to receive power from a provider).

In the above description, some technical details may be presented in terms of algorithms and symbolic representations of operations performed by firmware and/or within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining", "allocating," "dynamically allocating," "redistributing," "ignoring," "reallocating," "detecting," "performing," "polling," "registering," "monitoring," or the like, refer to the actions and processes of a device, or similar electronic system, that manipulates and transforms data represented as physical (e.g., electronic) quantities within the system's registers and memories into other data similarly represented as physical quantities within the system memories or registers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to a device for performing the operations herein. Such device may be specially constructed for the intended purposes (e.g., an application-specific integrated circuit, ASIC), or it may be an integrated circuit (IC) including a CPU subsystem that can execute instructions stored as firmware in a non-transitory computer-readable storage medium. Such non-transitory computer-readable storage medium may include, but is not limited to, read-only memories (ROMs), random access memories (RAMs), erasable programmable read-only memories, (EPROMs), electrically erasable programmable read-only memories (EEPROMs), flash memory, or any type of media suitable for storing electronic instructions. The term "computer-readable storage medium" should be taken to include a single medium that stores one or more sets of instructions. The term "computer-readable medium" should also be taken to include any medium that is capable of storing, encoding, or carrying a set of instructions for execution by a device and that causes the device to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A device comprising:

a power field effect transistor (FET) device instantiated on a first die, the power FET device comprising:

a first power FET;

a second power FET disposed back-to-back with respect to the first power FET, wherein the first power FET and the second power FET are connected to a common drain node within the first die;

a first replica FET coupled to the common drain node and configured to provide a sense current representative of a load current flowing through the power FET device; and a second replica FET coupled to the common drain node and configured to provide a sense voltage representative of a voltage of the common drain node;

a current sense circuit coupled to the first replica FET and the second replica FET and configured to use the sense voltage from the second replica FET to draw the sense current through the first replica FET; and a current limit circuit coupled to the current sense circuit and configured to:

receive the sense current from the current sense circuit;

generate a control signal based on the sense current; and provide the control signal to the second replica FET to control the load current flowing through the power FET device.

2. The device of claim 1, wherein the current sense circuit and the current limit circuit are included in an integrated circuit (IC) controller instantiated on a second die.

3. The device of claim 2, wherein the IC controller is configured as a Universal Serial Bus Power Delivery (USB-PD) controller.

4. The device of claim 2, wherein the power FET device and the IC controller are disposed within a single semiconductor package as a System-in-Package (SiP).

5. The device of claim 1, wherein the current sense circuit comprises an operational amplifier (op amp) configured as a closed-loop amplifier, wherein the sense voltage is coupled to a non-inverting input of the op amp, and wherein an inverting input of the op amp is coupled to the first replica FET through a voltage divider.

6. The device of claim 1, wherein the power FET device further comprises:

a third replica FET coupled to the common drain node and configured to provide an additional sense voltage representative of the voltage of the common drain node; and a fourth replica FET coupled to the common drain node and configured to provide an additional sense current.

7. The device of claim 6, wherein the first replica FET, the second replica FET, and the first power FET share a first gate terminal in common and the third replica FET, the fourth replica FET, and the second power FET share a second gate terminal in common.

8. The device of claim 1, wherein the first power FET and the second power FET are vertical FETs.

9. A device comprising:

a power field effect transistor (FET) device instantiated on a first die, the power FET device comprising:

a first power FET;

a second power FET disposed back-to-back with respect to the first power FET, wherein the first power FET and the second power FET are connected to a common drain node within the first die;

a first replica FET coupled to the common drain node and configured to provide a sense current representative of a load current flowing through the power FET device; and a second replica FET coupled to the common drain node and configured to provide a sense voltage representative of a voltage of the common drain node; and a current sense circuit coupled to the first replica FET and the second replica FET and configured to:

use the sense voltage from the second replica FET to draw the sense current through the first replica FET;

detect the voltage of the common drain node provided by the second replica FET; and generate a second voltage to be applied on a source terminal of the first replica FET to match a drain-to-source voltage drop across the first power FET to generate the sense current.

10. The device of claim 9, wherein the second voltage across the first replica FET is an opposite polarity compared to the first power FET.

11. A power field effect transistor (FET) device comprising:

a first power FET and a second power FET arranged in series and electrically coupled through a common drain node, wherein the first power FET and the second power FET are configured to deliver an output current to a load responsive to a first gate drive signal coupled to the first power FET through a first gate terminal of the power FET device, and a second gate drive signal coupled to the second power FET through a second gate terminal of the power FET device;

a first replica FET to provide a sense current that is proportional to the output current; and a second replica FET to provide a sense voltage corresponding to a voltage of the common drain node, wherein a drain of the first replica FET and the second replica FET are coupled to the common drain node, wherein the power FET device is instantiated on a first die disposed within a semiconductor package as a System-in-Package (SiP), and wherein the semiconductor package further comprises an integrated circuit (IC) controller instantiated on a second die.

12. The power FET device of claim 11, wherein gates of the first replica FET and the second replica FET are conductively coupled to the first gate terminal of the first power FET and the second gate terminal of the second power FET, respectively.

13. The power FET device of claim 11, further comprising a third replica FET, and a fourth replica FET, wherein a drain of the third replica FET and a drain of the fourth replica FET are coupled to the common drain node, and wherein gates of the third replica FET and the fourth replica FET are conductively coupled to the first gate terminal of the first power FET and the second gate terminal of the second power FET, respectively.

14. The power FET device of claim 11, wherein the first power FET and the second power FET are vertical FETs.

15. The power FET device of claim 11, wherein the integrated circuit (IC) controller further comprises:

a current sense circuit to receive the sense current; and a current limit circuit to limit the output current to a specified value.

16. The power FET device of claim 15, wherein the current limit circuit is configured to:

receive the sense current from the current sense circuit;

generate a control signal based on the sense current; and provide the control signal to the second replica FET to control the output current flowing through the power FET device.

17. The power FET device of claim 15, wherein the current sense circuit is configured to:

detect the voltage of the common drain node provided by the first replica FET;

generate a second voltage that has a same magnitude as the voltage of the common drain node; and apply the second voltage across the first replica FET to generate the sense current, wherein the second voltage across the first replica FET is an opposite polarity compared to the first power FET.

18. The power FET device of claim 11, wherein the IC controller is configured as a Universal Serial Bus Power Delivery (USB-PD) controller.

* * * * *